United States Patent
Kuo et al.

(10) Patent No.: US 7,246,019 B2
(45) Date of Patent: Jul. 17, 2007

(54) METHOD AND APPARATUS FOR MEASURING DELAY TIME

(75) Inventors: Shu-Hua Kuo, Hsinchu (TW); Jui-Ting Li, Taipei County (TW); Yanan Mou, Hsinchu (TW); Jiunn-Fu Liu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/161,254

(22) Filed: Jul. 28, 2005

(65) Prior Publication Data

US 2007/0027647 A1    Feb. 1, 2007

(51) Int. Cl.
*G01R 21/00* (2006.01)
(52) U.S. Cl. ...................................... 702/79
(58) Field of Classification Search ............. 702/79
See application file for complete search history.

(56) References Cited

U.S. PATENT DOCUMENTS 6,405,350 B1 * 6/2002 Tawada ..................... 716/5
6,925,404 B2 * 8/2005 Corr .......................... 702/117
2005/0012508 A1 * 1/2005 Pandya et al. .............. 324/628

* cited by examiner

*Primary Examiner*—John Barlow
*Assistant Examiner*—Demetrius Pretlow
(74) *Attorney, Agent, or Firm*—Jianq Chyun IP Office

(57) ABSTRACT

A method and apparatus for measuring a delay time is provided. First, a plurality of first/second phase signals, a first/second standard signal, and an inverse signal of the second standard signal are generated. The inverse signal of the second standard signal is applied to a second conductive line close to at least an adjacent conductive line. The first/second standard signal is applied to the first/second conductive line to obtain a first/second transmission signal. Then, the first/second transmission signal is sequentially sampled by the first/second phase signals to sequentially obtain a plurality of first/second sampling results. The first/second sampling results are sequentially identified by a first/second identifying level to obtain a first/second identification result. Accordingly, the delay time between the first and the second transmission signal may be obtained by comparing the different the second and the first identification result.

10 Claims, 3 Drawing Sheets

METHOD AND APPARATUS FOR MEASURING DELAY TIME

BACKGROUND OF THE INVENTION

1. Field of the Invention

The present invention relates to a method and an apparatus for measuring a delay time. More particularly, the present invention relates to a method and an apparatus for measuring a delay time caused by crosstalk.

2. Description of Related Art

As the process of semiconductor integrated circuits (IC) progressively advances, the integration of the IC is increased and correspondingly the line width of the IC reduces. Therefore, the influence caused by the interference or the crosstalk in the connecting lines of the IC get more and more obvious with the increasing integration of the IC. In general, the crosstalk in the IC is usually caused by inductance or capacitance between two adjacent conductors, conductive layers, conducting wires, transmission lines, or connecting lines. In the IC, when a signal or energy is transmitted on a transmission line, the energy may influence another adjacent transmission line by coupling to the adjacent transmission line via the mutual inductance or the mutual capacitance between the two transmission lines. Conventionally, the crosstalk may be classified into near end crosstalk and far end crosstalk according to the distance between the two transmission lines. Particularly, when the density or length of the wiring of the layout of the IC increases, the influence of the crosstalk may be more obvious. For example, the crosstalk phenomenon of a connect line or bus line with a long length is generally serious.

In the IC, when a signal is transmitted on a transmission line, and a crosstalk phenomenon is generated between the transmission line and another adjacent transmission line, the transmission time of the signal may be influenced by the crosstalk, i.e., the transmission of the signal may be delayed by a delay time. At this moment, the delay time may influence the timing of the signals of the IC and generates an error, or even may result in some error of the timing, operation or function of the IC. Thus, the performance or the reliability of the IC may be adversely influenced, or sometimes may even lead to IC failure. Therefore, a crosstalk measuring method or a measuring device for effectively measuring or detecting the influence of the crosstalk, for example, for measuring the delay time, is very important.

SUMMARY OF THE INVENTION

Therefore, the present invention is directed to an apparatus for measuring a signal transmission time of two conducting wire with and without influenced by crosstalk respectively and obtaining a delay time caused by crosstalk by comparing the two signal transmission times.

In addition, the present invention is directed to a method of measuring a delay time for measuring a signal transmission time of two conducting wire with and without influenced by crosstalk respectively and obtaining a delay time caused by crosstalk by comparing the two transmission times.

According to an embodiment of the present invention, an apparatus for measuring a delay time comprises, for example but not limited to, a first measurement device and a second measurement device. The first/second measurement device may comprise a first/second pulse generation device and a first/second signal generation device. The first pulse generation device may be adopted for generating a plurality of first phase signals and a first standard signal, wherein a first conducting wire receives the first standard signal and outputs a first transmission signal. The first signal generation device is connected to the first pulse generation device and may be adopted for receiving the first phase signals and sampling the first transmission signal by sequentially using the first phase signals to sequentially obtain a plurality of first sampling results, then the first sampling results are identified by sequentially using a first identifying level to obtain a first identification result. The second pulse generation device may be adopted for generating a plurality of second phase signals and a second standard signal, wherein at least one adjacent conducting wire close to another conducting wire receives an inverse signal of the second standard signal, and the another conducting wire receives the second standard signal and outputs a second transmission signal. The second signal generation device is connected to the second pulse generation device and may be adopted for receiving the second phase signals and sampling the second transmission signal by sequentially using the second phase signals to sequentially obtain a plurality of second sampling results, then the second sampling results is sequentially identified by a second identifying level to obtain a second identification result. Accordingly, a delay time between the first transmission signal and the second transmission signal may be obtained from a difference between the first identification result and the second identification result.

According to an embodiment of the present invention, a method of measuring a delay time comprises the following steps. First, a plurality of first phase signals and a first standard signal are generated, wherein the first standard signals are input to a first conducting wire to obtain a first transmission signal. Then, the first transmission signal is sampled by sequentially using the first phase signals to sequentially obtain a plurality of first sampling results, then the first sampling results are identified by sequentially using the first identifying level to obtain a first identification result. Next, a plurality of second phase signals, a second standard signal and an inverse signal of the second standard signal are generated, wherein the inverse signal is input to at least one adjacent conducting wire close to another conducting wire, and the second standard signals are input to the another conducting wire to obtain a second transmission signal. Thereafter, the second transmission signal is sampled by sequentially using the second phase signals to sequentially obtain a plurality of second sampling results, then the second sampling results are identified by sequentially using the second identifying level to obtain a second identification result. Accordingly, a delay time between the first transmission signal and the second transmission signal may be obtained by comparing a difference between the first identification result and the second identification result.

In one embodiment of the present invention, a method of identifying the first or the second sampling results by sequentially using the first or the second identifying level to obtain the first or the second identification result may comprise the following steps. When the first or the second sampling result is larger than the first or the second identifying level, a compared value 1 (or 0) is obtained. When the first or the second sampling result is less than the first or the second identifying level, a compared value 0 (or 1) is obtained, then the first or second identification result is obtained from an sequential arrangement of the compared values.

In one embodiment of the present invention, the first or second signal generating device may comprise a plurality of comparing devices. Each comparing device receives one of the phase signals for sampling the first or the second transmission signal to obtain the corresponding first or second sampling result respectively, and identifies the corresponding first or second sampling result by using the first or the second identifying level to obtain a compared value. In addition, when the first or the second sampling result is larger than the first or the second identifying level, a compared value 1 (or 0) is obtained, when the first or the second sampling result is less than the first or the second identifying level, a compared value 0 (or 1) is obtained.

In one embodiment of the present invention, each compare device comprises a flip flop.

In one embodiment of the present invention, the first phase signals and the second phase signals are the same. In another embodiment of the present invention, the first standard signal and the second standard signal are the same. In still another embodiment of the present invention, the first identifying level and the second identifying level are the same.

In one embodiment of the present invention, a distance between the one conducting wire and any other conducting wire is larger than a distance between the another conducting wire and any other conducting wire.

In one embodiment of the present invention, the first or the second pulse generating device comprises a voltage controlled oscillator or, for example, a delayed lock loop.

Accordingly, in the present invention, the transmission time influenced by crosstalk and the transmission time without being influenced by crosstalk may be measured by two measurement devices respectively. Accordingly, the delay time of the transmission time caused by crosstalk is proportional to or identical to the difference between the transmission time without being influenced by crosstalk and the transmission time being influenced by crosstalk.

One or part or all of these and other features and advantages of the present invention will become readily apparent to those skilled in this art from the following description wherein there is shown and described one embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
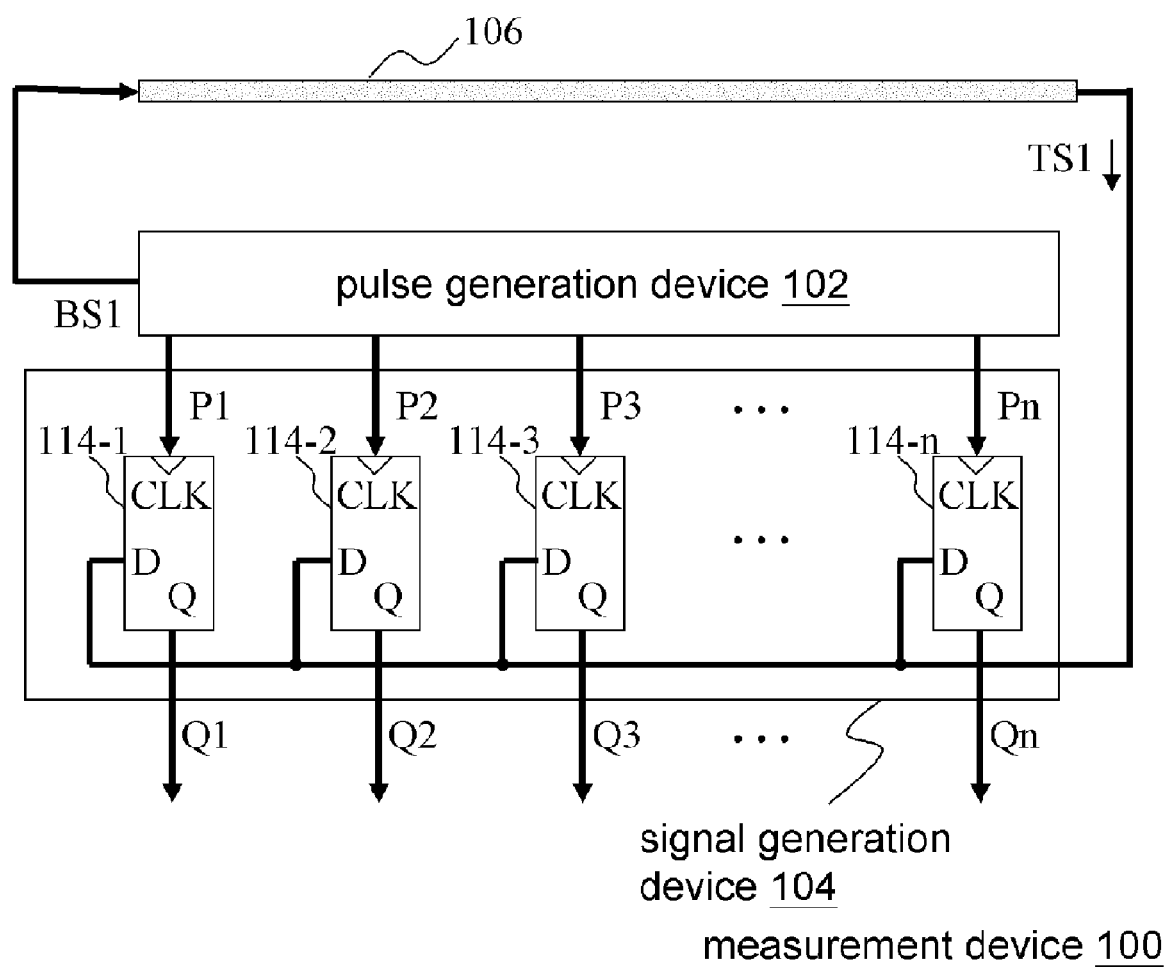
FIG. 1 illustrates an apparatus for measuring a transmission signal on a conducting wire without being influenced by crosstalk according to one embodiment of the present invention.

FIG. 1 illustrates an apparatus for measuring a transmission signal on a conducting wire without being influenced by crosstalk according to one embodiment of the present invention. Referring to FIG. 1, the apparatus 100 may be adaptable for measuring a transmission signal on a conducting wire without being influenced by a crosstalk. The apparatus 100 may comprise, for example but not limited to, a pulse generating device 102, and a signal generating device 104, and may be adopted for measuring the transmission signal on the conducting wire 106. The pulse generating device 102 may be adopted for generating a series of phase signals P1, P2 to Pn being input to the signal generating device 104, wherein n may be any positive integer. In addition, the pulse generating device 102 may also be adopted for generating a standard signal BS1 being input to the conducting wire 106. In one embodiment of the present invention, the pulse generating device 102 may comprise, for example, a voltage controlled oscillator (VCO) or any other timing generating device, such as delayed lock loop. The conducting wire 106 receives the standard signal BS1 and outputs a first transmission signal TS1. In one embodiment of the present invention, the conducting wire 106 may comprise an independent conducting wire, or a conducting wire separated from another conducting wire with a long distance so that the crosstalk between the conducting wires may be ignored.

The signal generating device 104 may be connected to the pulse generating device 102 for receiving phase signals P1, P2 to Pn, and may be connected to the conducting wire 106 for receiving the first transmission signal TS1. In the signal generating device 104, for example but not limited, the first transmission signal TS1 may be sequentially sampled by each phase signal P1, P2 to Pn to obtain a sequence of sampling results. Then, the sampling results are sequentially identified by a predetermined identifying level DL to obtain a sequence of compared values Q1, Q2 to Qn, wherein the sequentially arranged compared values Q1, Q2 to Qn is presented as an identification result Q1~Qn. For example, but not limited to, when the first transmission signal TS1 is sampled by the phase signal P1, if the sampling result is larger than the identifying level DL, the compared value Q1 may be 1. Alternatively, if the sampling result is less than the identifying level DL, the compared value Q1 may be 0. Similarly, the method may be provided for sequentially identifying the sampling results sampled by phase signals P2 to Pn to obtain the identification result Q1~Qn.

Referring to FIG. 1, the signal generation device 104 may comprise a plurality of compare devices 114-1, 114-2 to 114-n. In one embodiment of the present invention, each comparing device may comprise, for example but not limited to, a flip flop. As shown in FIG. 1, the comparing devices are exemplarily illustrated as D-type flip flops. However, it should be noted that, the devices such as the comparing device or others of the present invention may comprise any other device with same or similar functions, and thus can not be limited by the embodiments or the drawings of the present invention. Referring to FIG. 1, the timing input terminal CLK of each comparing device 114-1, 114-2 to 114-n receives one of the corresponding phase signal P1, P2 to Pn respectively, and the input terminal D of all the compare devices receives the first transmission signal TS1. Therefore, the first transmission signal TS1 is sampled and identified by each comparing device 114-1, 114-2 to 114-n by a predetermined identifying level DL identify, and thus the compared values Q1, Q2 to Qn are outputted from each output terminal Q respectively. Finally, an identification result Q1~Qn is obtained.

Figure 3:
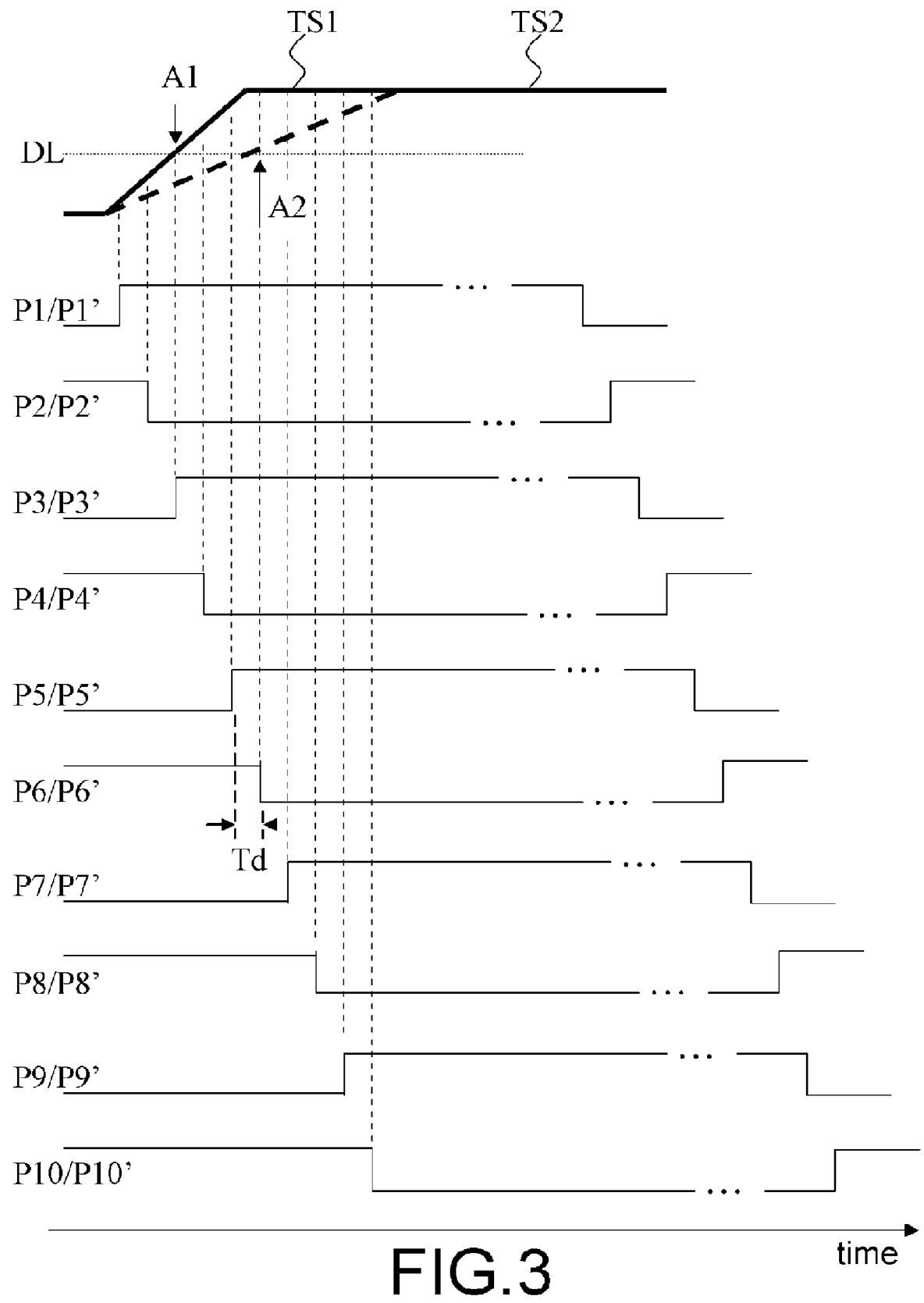
FIG. 3 is a plot of a measurement result of the measurement devices according to one embodiment of the present invention.

FIG. 3 is a plot of a measurement result obtained by the measurement devices according to one embodiment of the present invention. Referring to FIG. 3, for example but not limited to, if the signal generating device 104 shown in FIG. 1 has 10 comparing devices 114-1, 114-2 to 114-10, the pulse generation device 102 generates 10 phase signals P1, P2 to P10 sequentially being input to the corresponding compare devices 114-1, 114-2 to 114-10 respectively. In one embodiment of the present invention, any two adjacent phase signals are inverse to each other, for example, the phase signals P1 and P2, or the phase signals P2 and P3 are mutually inverse. In addition, the starting times of every phase signal are mutually different.

Referring to FIG. 3, the bold solid line represents the sampling results of the first transmission signal TS1. Therefore, if the identifying level DL shown in FIG. 3 is adopted for identifying the first transmission signal TS1, at the left side of the arrow A1, the sampling results of the first transmission signal TS1 are less than the identifying level DL, thus the compared values Q1=Q2=0. In addition, at the right side of the arrow A1, the sampling results of the first transmission signal TS1 are larger than the identifying level DL, thus the compared values Q3=Q4=Q5=Q6=Q7=Q8=Q9=Q10=1. Therefore, the signal generation device 104 outputs an identification result Q1~Q10=0011111111.

Figure 2:
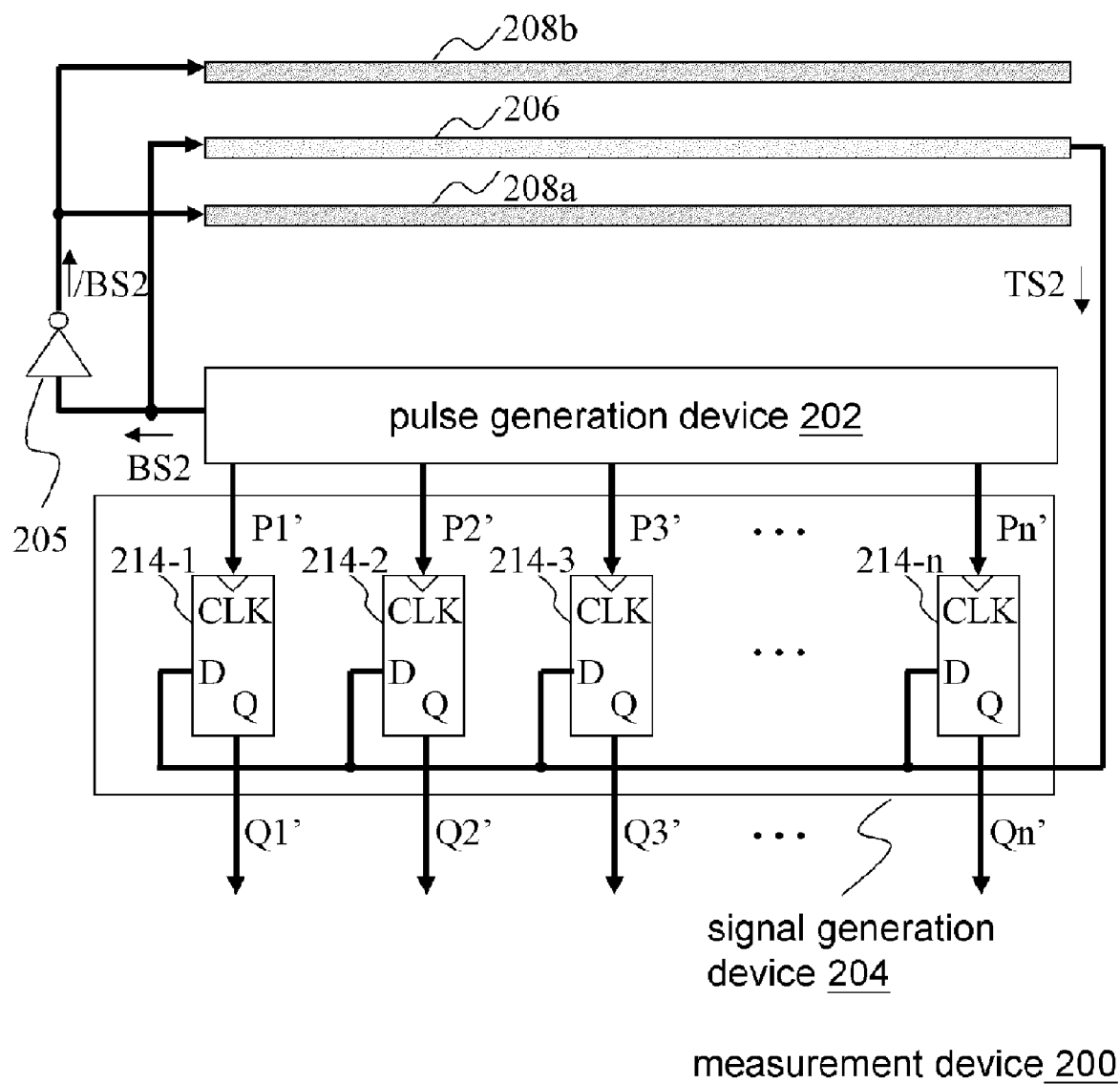
FIG. 2 illustrates an apparatus for measuring a transmission signal on a conducting wire being influenced by crosstalk according to another embodiment of the present invention.

FIG. 2 illustrates an apparatus for measuring a transmission signal on a conducting wire being influenced by crosstalk according to another embodiment of the present invention. Referring to FIG. 2, the apparatus 200 may be suitable for measuring a transmission signal on a conducting wire being influenced by a crosstalk. The apparatus 200 may comprise, for example but not limited to, a pulse generating device 202, a signal generating device 204, and an inverse device 205, and may be adopted for measuring the crosstalk influence of the transmission signal on the conducting wire 206 resulted from the adjacent conducting wires 208a and 208b. The pulse generating device 202 may be adopted for generating a series of phase signal P1, P2 to Pn being input to the signal generation device 204, wherein n may be a positive integer. In addition, the pulse generating device 202 may also be adopted for generating a standard signal BS2 being input to the conducting wire 206. An inverter 205 is connected between the pulse generating device 202 and the conducting wires 208a and 208b, and may be adopted for inverting the standard signal BS2 into an inverse signal/BS being input to the conducting wires 208a and 208b. In one embodiment of the present invention, the pulse generating device 202 may comprise a voltage controlled oscillator or other any timing generating device, such as delayed lock loop. The conducting wire 206 may receive the standard signal BS2 and output a second transmission signal TS2. In one embodiment of the present invention, the conducting wire 206 may comprise any conducting wire to be measured, for example but not limited to, a conducting wire close to another conducting wire so that the crosstalk between the conducting wires are obvious.

The signal generating device 204 may be connected to the pulse generating device 202 for receiving the phase signals P1', P2' to Pn', and may be connected to the conducting wire 206 for receiving the second transmission signal TS2. In the signal generating device 204, the second transmission signal TS2 may be sampled by each phase signal P1', P2' to Pn' sequentially to obtain a sequence of sampling results. Then, the sampling results are identified by a predetermined identifying level DL sequentially to obtain a sequence of compared values Q1', Q2' to Qn', wherein the sequentially arranged compared values Q1', Q2' to Qn' is presented as an identification result Q1'~Qn'. The method of identifying the sampling results to obtain the compared values Q1', Q2' to Qn' may be, for example but not limited to, same as or similar to the embodiment as shown in FIG. 1 as described above.

Referring to FIG. 2, the signal generating device 204 may also comprise a plurality of comparing devices 214-1, 214-2 to 214-n. In one embodiment of the present invention, each comparing device may comprise, for example but not limited to, a flip flop. The function and operation method of the comparing devices 214-1, 214-2 to 214-n in FIG. 2 may be same as or similar to the embodiment of FIG. 1 as described above.

It is noted that, FIG. 2 is similar to FIG. 1 except that the conducting wires 208a and 208b are disposed adjacent to the conducting wire 206, and an inverter 205 disposed between the pulse generation device 202 and the conducting wires 208a and 208b. In one embodiment of the present invention, if the measurement parameters or condition of FIG. 2 are the same as FIG. 1, for example but not limited to, the phase signals P1', P2' to Pn' and the phase signals P1, P2 to Pn are the same, the standard signals BS2 and BS1 are the same as, and the identifying levels DL' and DL are the same. Therefore, the time delay between the transmission signals TS2 of FIG. 2 and TS1 of FIG. 1 generated by the crosstalk may be obtained by comparing the compare results or the identification result of transmission signals TS2 and TS1.

Referring to FIG. 3, for example but not limited to, if the signal generation device 204 shown in FIG. 2 has 10 comparing devices 214-1, 214-2 to 214-10, the pulse generating device 202 sequentially generates 10 phase signals P1', P2' to P10' and sequentially input to the corresponding comparing devices 214-1, 214-2 to 214-10 respectively. In one embodiment of the present invention, as shown in FIG. 3, the phase signals P1', P2' to Pn' and the phase signals P1, P2 to Pn are the same, the standard signals BS2 and BS1 are the same, and the identifying levels DL' and DL are the same.

Referring to FIG. 3, wherein bold dotted line represents the sampling results of the second transmission signal TS2. It is noted that, the same identifying level DL as shown in FIG. 3 is adopted for identifying second transmission signal TS2. Therefore, at the left side of the arrow A2, the sampling results of the second transmission signal TS2 are less than the identifying level DL, thus the compared values Q1'=Q2'=Q3'=Q4'=Q5'=0. In addition, at the right side of the arrow A2, the sampling results of the second transmission signal TS2 are larger than the identifying level DL, thus the compared values Q6'=Q7'=Q8'=Q9'=Q10'=1. Therefore, the signal generating device 204 outputs an identification result Q1'~Q10'=0000011111. Accordingly, by comparing the identification result Q1'~Q10'=0000011111 and Q1~Q10=0011111111, the delay time of the transmission signals TS1 caused by crosstalk is equal to the difference between the first transmission signal TS1 and the second transmission signal TS2, i.e., about three times of the time interval Td between the phase signals.

In another embodiment of the present invention, when the first or the second transmission signal is larger than the corresponding identifying level DL or DL', the compared value may be 0. Alternatively, when the first or the second transmission signal TS1 or TS2 is less than the identifying level DL or DL', the compared value may be 1.

In one embodiment of the present invention, the conducting wires 206, 208a or 208b may comprise, for example but not limited to, a conducting wire, conductive layer or connect line of an IC in the same metal layer. The conducting wire 106 may be, for example but not limited to, a conducting wire, conductive layer or connect line in the same metal layer or at different metal layer with the conducting wire 206.

Accordingly, in the present invention, the transmission time influenced by crosstalk and the transmission time without influenced by crosstalk may be measured by two measurement devices respectively. Accordingly, the delay time of the transmission time caused by crosstalk is proportional to or identical to the difference between the transmission time without influenced by crosstalk and the transmission time influenced by crosstalk.

The foregoing description of the embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An apparatus for measuring a delay time, comprising:
   a first measurement device, comprising:
      a first pulse generating device, for generating a plurality of first phase signals and a first standard signal, wherein a first conducting wire receives the first standard signal and outputs a first transmission signal; and
      a first signal generating device, connected to the first pulse generation device, for receiving the first phase signals and sampling the first transmission signal by sequentially using the first phase signals to sequentially obtain a plurality of first sampling results, wherein the first sampling results are identified by sequentially using a first identifying level to obtain a first identification result; and
   a second measurement device, comprising:
      a second pulse generating device, for generating a plurality of second phase signals and a second standard signal, wherein at least an adjacent conducting wire close to a second conducting wire receives an inverse signal of the second standard signal, and the second conducting wire receives the second standard signal and outputs a second transmission signal; and
      a second signal generating device, connected to the second pulse generation device, for receiving the second phase signals and sampling the second transmission signal by sequentially using the second phase signals to sequentially obtain a plurality of second sampling results, wherein the second sampling results are sequentially identified by a second identifying level to obtain a second identification result;
   wherein, a delay time between the first transmission signal and the second transmission signal is obtained from a difference between the first identification result and the second identification result.

2. The apparatus of claim 1, wherein of the apparatus being operated for identifying the first or the second sampling results by sequentially using the first or the second identifying level to sequentially obtain the first or the second identification result comprises:
   the apparatus obtaining a first compared value when the first sampling result is larger than the second identifying level and obtaining a second compared value when the first sampling result is less than the second identifying level, and wherein the first or second identification result is obtained from an sequential arrangement of the compared values.

3. The apparatus of claim 1, wherein the first or second signal generating device comprises:
   a plurality of comparing devices, wherein each of the comparing devices receives one of the phase signals for sampling the first or the second transmission signal to obtain the corresponding first or second sampling result respectively, and identifies the corresponding first or second sampling result by using the first or the second identifying level to obtain a compared value.

4. The apparatus of claim 3, wherein when the first sampling result is larger than the second identifying level, a first compared value is obtained and when the first sampling result is less than the second identifying level, a second compared value is obtained, and vice versa.

5. The apparatus of claim 1, wherein each of the comparing devices comprises a flip flop.

6. The apparatus of claim 1, wherein the first phase signals and the second phase signals are the same.

7. The apparatus of claim 1, wherein the first standard signal and the second standard signal are the same.

8. The apparatus of claim 1, wherein the first identifying level and the second identifying level are the same.

9. The apparatus of claim 1, wherein a distance between the first conducting wire and any other conducting wire is larger than a distance between the second conducting wire and any other conducting wire.

10. The apparatus of claim 1, wherein the first or the second pulse generating device comprises a voltage controlled oscillator or a delayed lock loop.

* * * * *